(12) United States Patent
Wen et al.

(10) Patent No.: US 7,478,295 B2
(45) Date of Patent: Jan. 13, 2009

(54) METHOD AND APPARATUS OF FAULT DIAGNOSIS FOR INTEGRATED LOGIC CIRCUITS

(75) Inventors: Xiaoqing Wen, Fukuoka (JP); Seiji Kajihara, Fukuoka (JP)

(73) Assignee: Kyushu Institute of Technology, Kitakyushu-shi, Fukuoka (JP)

( * ) Notice: Subject to any disclaimer, the term of this patent is extended or adjusted under 35 U.S.C. 154(b) by 391 days.

(21) Appl. No.: 11/184,830

(22) Filed: Jul. 20, 2005

(65) Prior Publication Data

US 2006/0107157 A1    May 18, 2006

(30) Foreign Application Priority Data

Oct. 20, 2004    (JP) ............................. 2004-305064

(51) Int. Cl.
G01R 31/28    (2006.01)
G06F 11/00    (2006.01)
(52) U.S. Cl. .................... 714/724; 714/25; 714/737
(58) Field of Classification Search .................. 714/25, 714/724
See application file for complete search history.

(56) References Cited

OTHER PUBLICATIONS

David B. Lavo, et al., "Multiplets, Models, and the Search for Meaning: Improving Per-Test Fault Diagnosis", Proc. Intl. Test Conf., pp. 250-259, 2002.*
Wen et al., "On Per-Test Fault Diagnosis Using the X-Fault Model", IEEE, pp. 633-640, Nov. 2004.*
Liu, An Efficient Method for Improving the Quality of Per-Test Fault Diagnosis, IEEE, pp. 648-651, Nov. 2004.*
David B. Lavo, et al., "Beyond the Byzantine Generals: Unexpected Behavior and Bridging Fault Diagnosis", Proc. Intl. Test Conf., pp. 611-619, 1996.
Srikanth Venkataraman, et al., "POIROT: A Logic Fault Diagnosis Tool and Its Applications", Proc. Intl. Test Conf., pp. 253-262, 2000.
Steven D. Millman, et al., "Diagnosing CMOS Bridging Faults With Stuck-At Fault Dictionaries", Proc. Intl. Test Conf., pp. 860-870, 1990.
Peter C. Maxwell, et al., "Biased Voting: A Method for Simulating CMOS Bridging Faults in the Presence of Variable Gate Logic Thresholds", Proc. Intl., Test Conf., pp. 63-72, 1993.
Weiwei Mao, et al., "Quietest: A Quiescent Current Testing Methodology for Detecting Leakage Faults", Proc. ICCA D'90, pp. 280-283, Nov. 1990.
Shi-Yu Huang, "Speeding Up the Byzantine Fault Diagnosis Using Symbolic Simulation", Pro. VLSI Test Symp., pp. 193-198, 2002.
Miron Abramovici, et al., "Multiple Fault Diagnosis in Combinational Circuits Based on an Effect-Cause Analysis", IEEE Trans. on Comp., vol. 29, No. 6, pp. 451-460, 1980.
Henry Cox, et al., "A Method of Fault Analysis for Test Generation and Fault Diagnosis", IEEE Trans. On Computer-Aided Design, vol. 7, No. 7, pp. 813-833, 1988.

(Continued)

Primary Examiner—Cynthia Britt
Assistant Examiner—John J Tabone, Jr.
(74) Attorney, Agent, or Firm—McGinn IP Law Group, PLLC

(57) ABSTRACT

In a method for diagnosing faults in an integrated logic circuit including a plurality of input signal lines, a plurality of output signal lines and a plurality of gates connected between the input signal lines and the output signal lines, different symbols are injected into fanout branches of one faulty candidate of the gates.

17 Claims, 13 Drawing Sheets

OTHER PUBLICATIONS

Hiroshi Takahashi, et al., "On Diagnosing Multiple Stuck-at Faults Using Multiple and Single Fault Simulation in Combinational Circuits", IEEE Trans. on Computer-Aided Design, vol. 21, No. 5, pp. 362-368, 2002.

Thomas Bartenstein, et al., "Diagnosing Combinational Logic Designs Using the Single Location At-a-Time (SLAT) Paradigm", Proc. Intl. Test Conf., pp. 281-296, 2001.

John A. Waicukauski, et al., "Failure Diagnosis of Structured VLSI", IEEE Design and Test of Comp., vol. 6, No. 4, pp. 49-60, 1989.

* cited by examiner

| INPUT VECTOR | | | | | | EXPECTED OUTPUT RESPONSE EXO | | |
|---|---|---|---|---|---|---|---|---|
| VEC | $I_1$ | $I_2$ | $I_3$ | $I_4$ | $I_5$ | $O_1$ | $O_2$ | $O_3$ |
| VEC1 | ⋮ | ⋮ | ⋮ | ⋮ | ⋮ | ⋮ | ⋮ | ⋮ |
| ⋮ | ⋮ | ⋮ | ⋮ | ⋮ | ⋮ | ⋮ | ⋮ | ⋮ |
| ⋮ | ⋮ | ⋮ | ⋮ | ⋮ | ⋮ | ⋮ | ⋮ | ⋮ |
| VECi | 0 | 1 | 1 | 0 | 1 | 1 | 0 | 1 |
| ⋮ | ⋮ | ⋮ | ⋮ | ⋮ | ⋮ | ⋮ | ⋮ | ⋮ |
| VECm | ⋮ | ⋮ | ⋮ | ⋮ | ⋮ | ⋮ | ⋮ | ⋮ |

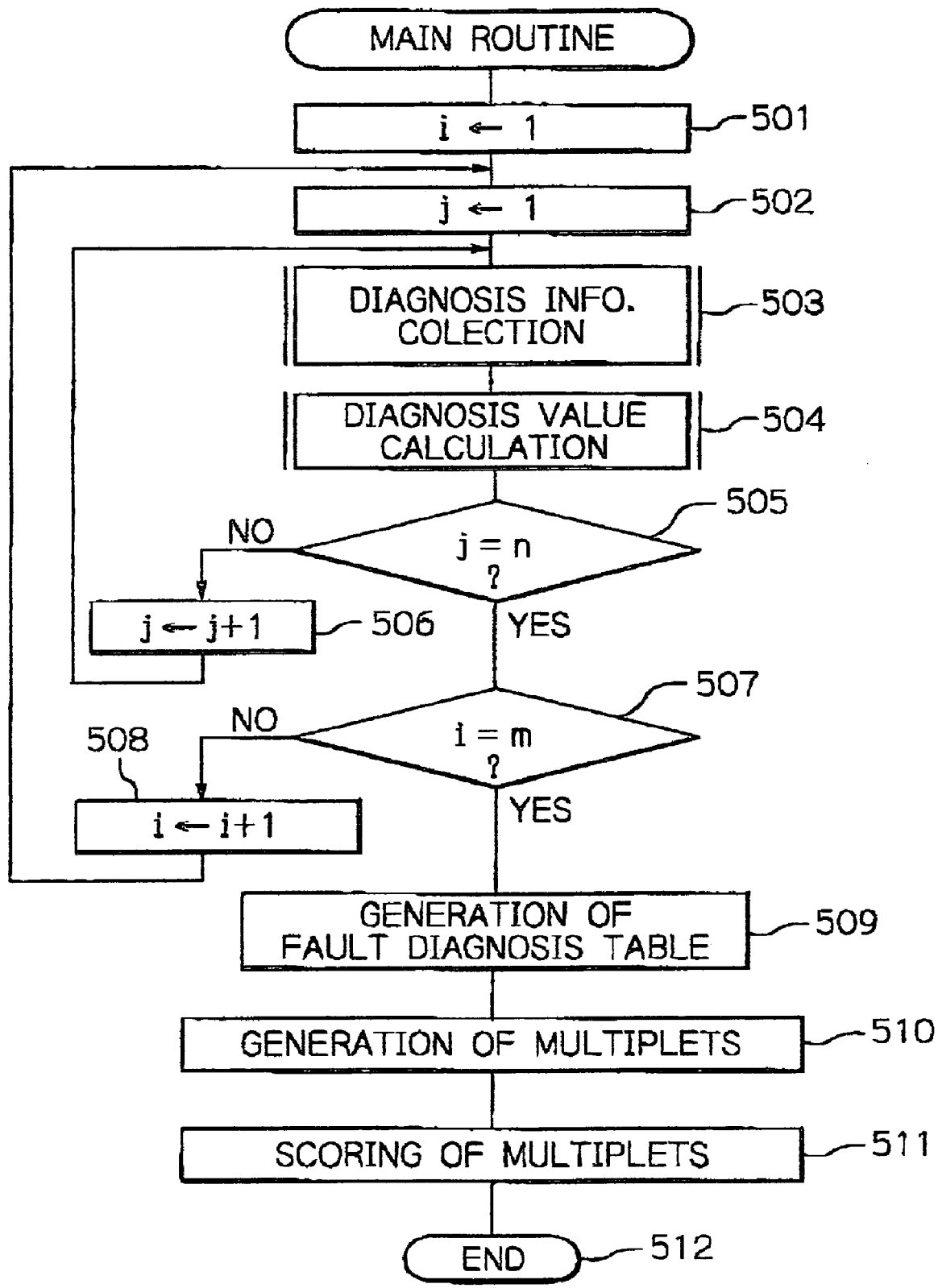

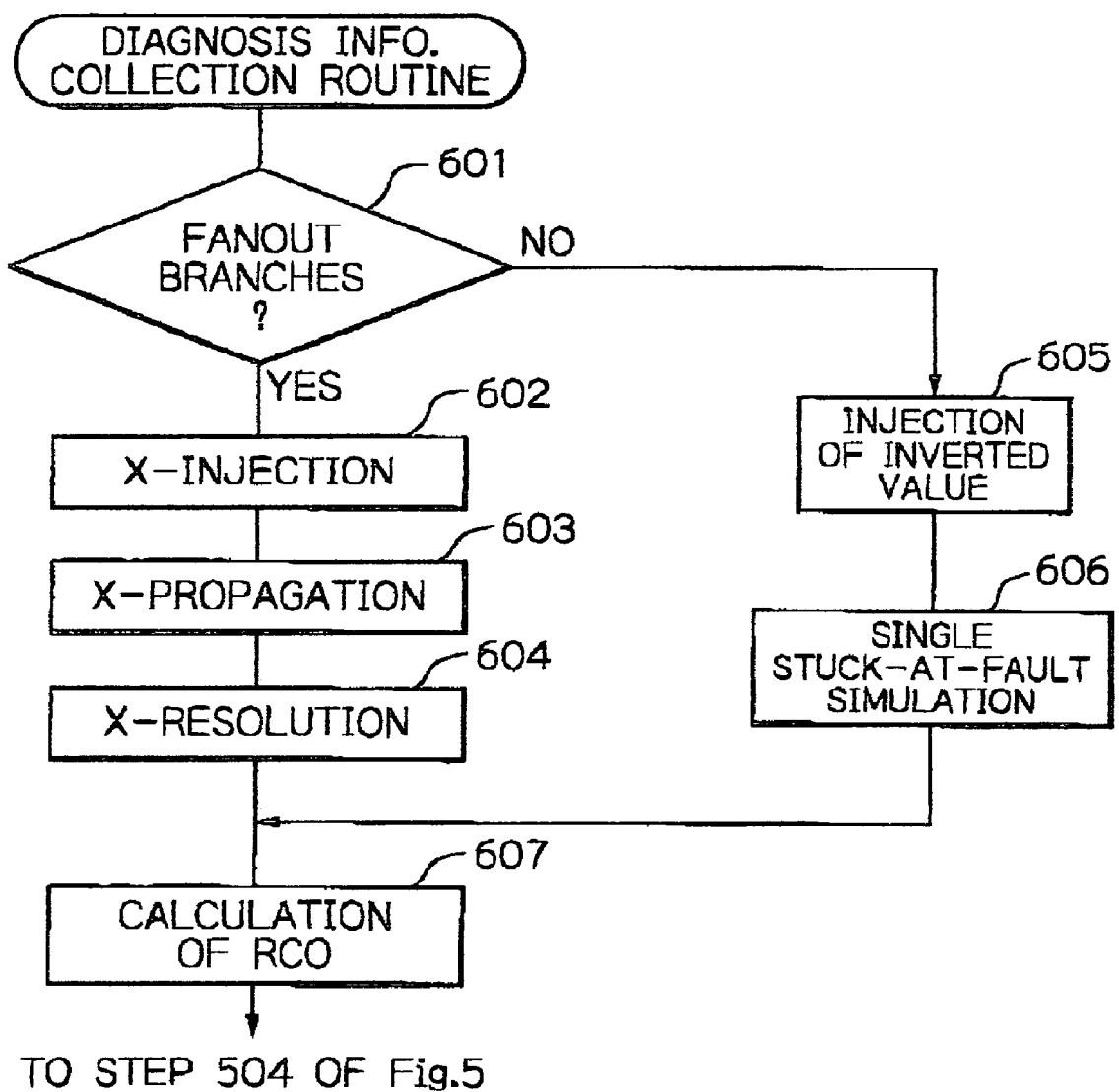

Fig. 10A
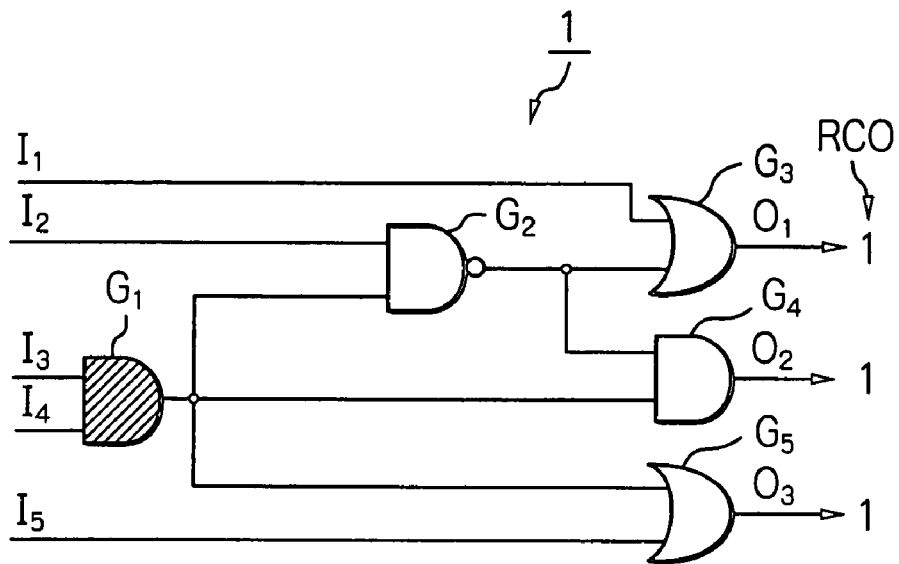
Fig. 10B
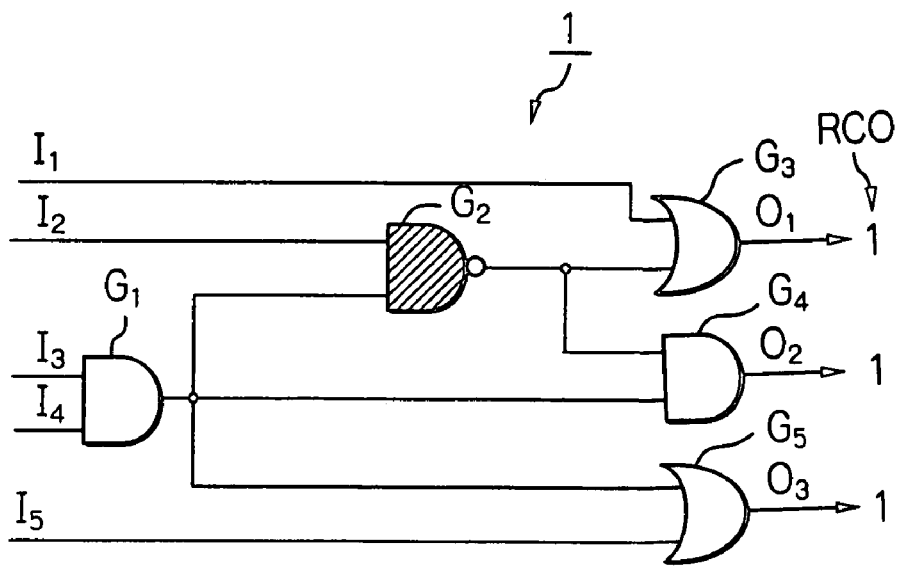
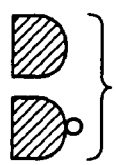 FAULTY GATE

Fig. 14

FAULT DIAGNOSIS TABLE

| FAILING INPUT VECTOR | FAULTY GATE | | | | |
|---|---|---|---|---|---|
| | $G_1$ | $G_2$ | $G_3$ | $G_4$ | $G_5$ |
| FVEC1 | 0.81 | 0.65 | 0 | 0 | 0 |
| FVEC2 | 0 | 0 | 0.61 | 0.17 | 0 |
| FVEC3 | 0.26 | 0 | 0.83 | 0 | 0 |
| FVEC4 | 0 | 0 | 0 | 0 | 0.55 |
| AVERAGE DIAGNOSIS VALUE | 0.27 | 0.16 | 0.36 | 0.04 | 0.14 |

METHOD AND APPARATUS OF FAULT DIAGNOSIS FOR INTEGRATED LOGIC CIRCUITS

BACKGROUND OF THE INVENTION

1. Field of the Invention

The present invention relates to a method and apparatus for carrying out fault diagnosis for integrated logic circuits (or "circuits" hereafter), to achieve high diagnostic resolution even in the presence of complex, dynamic, and/or multiple defects, all inevitable in deep-submicron circuits.

2. Description of the Related Art

Failure analysis is the process of localizing physical defects in a failing circuit and identifying their root causes. Failure analysis is indispensable for silicon debugging, yield improvement, and reliability enhancement. The key part in the failure analysis is defect localization, which is achieved by first using a fault diagnosis procedure to identify suspicious areas in a failing circuit and then using physical inspection means, such as an electron beam (EB) tester to search in the identified suspicious areas for actual defects.

Fault diagnosis is the process of identifying suspicious areas in a failing circuit by making use of logical faults assumed in a circuit model. A logical fault has two attributes: location and logical behavior. In a gate-level circuit model, the location attribute is one or more nets or pins, and the logical behavior attribute is one or more logic values. Fault modeling defines these attributes in a general manner. The process of identifying faults, with likely link to physical defects, is known as fault diagnosis. Physical defects can be characterized from three aspects: complexity (simple or complex), temporality (static or dynamic), and cardinality (single or multiple). A simple defect forces a single site to a fixed logic value of 0 or 1. A complex defect, such as a resistive short or open, causes multiple effects around the defect site. For example, a complex defect in a fanout gate forces its output to an intermediate voltage and multiple faulty logic values may appear at its fanout branches depending on the threshold voltages of the branches (see: D. Lavo, T. Larrabee, and B. Chess, "Beyond the Byzantine Generals: Unexpected Behavior and Bridging Fault Diagnosis", Proc. Intl. Test Conf., pp. 611-619, 1996). Such a complex defect is called a Byzantine defect in this paper, A static defect shows the same behavior for all input vectors, while a dynamic defect changes its behavior for different input vectors because the strength of a signal can vary for different input conditions. Finally, a circuit may contain a single defect or multiple defects.

Based on this defect classification, the defect scenario of a failing circuit can be trivial or non-trivial. The existence of a simple, static, and single defect is a trivial defect scenario, whereas the existence of complex, dynamic, or multiple defects is a non-trivial defect scenario.

In a trivial defect scenario, the failing circuit has exactly one constant defective effect at one location. Techniques based on the single stuck-at fault model, which assume a line to be fixed at a logic value of 0 or 1, can readily achieve accurate diagnosis for this scenario.

In reality, a failing circuit is more likely to have a nontrivial defect scenario. In this case, the circuit either has defective effects at multiple locations or the behavior of a defect changes for different input vectors. Obviously, the single stuck-at fault model cannot represent physical defects of this type, and accurate fault diagnosis is generally difficult to achieve.

The defect complexity issue in a non-trivial defect scenario has been addressed by using a combination of simple fault models or by using a realistic fault model. For example, a technique (see: S. Venkataraman and S. Drummonds, "POIROT: A Logic Fault Diagnosis Tool and Its Applications", Proc. Intl. Test Conf., pp. 253-262, 2000) uses four fault models to cover various defects. On the other hand, various realistic fault models, such as stuck-open (see: S. Venkataraman and S. Drummonds, "POIROT. A Logic Fault Diagnosis Tool and Its Applications", Proc. Intl. Test Conf., pp. 253-262, 2000), bridging (see: S. D. Millman, E. J. McCluskey, and J. M. Acken, "Diagnosing CMOS Bridging Faults with Stuck-At Fault Dictionaries", Proc. Intl. Test Conf., pp. 860-870, 1990; P. Maxwell and R. Aiken, "Biased Voting: A Method for Simulating CMOS Bridging Faults in the Presence of Variable Gate Logic Thresholds", Proc. Intl. Test Conf., pp. 63-72, 1993.), transistor leakage (W. Mao and R. K. Gulati, "QUIETEST: A Quiescent Current Testing Methodology for Detecting Short Faults", Proc. ICCAD' 90, pp. 280-283, November 1990), and Byzantine (see: D. Lavo, T. Larrabee, and B. Chess, "Beyond the Byzantine Generals: Unexpected Behavior and Bridging Fault Diagnosis", Proc. Intl. Test Conf., pp. 611-619, 1996; S. Huang, "Speeding Up the Byzantine Fault Diagnosis Using Symbolic Simulation", Proc. VLSI Test Symp., pp. 193-198, 2002), to better reflect actual defect mechanisms.

The defect cardinality issue in a non-trivial defect scenario has been addressed (see: M. Abramovici and M. Breuer, Multiple Fault Diagnosis in Combinational Circuits Based on an Effect-Cause Analysis, IEEE Trans. on Comp., vol. 29, no. 6, pp. 451-460, 1980; H. Cox and J. Rajski, "A Method of Fault Analysis for Test Generation and Fault Diagnosis", IEEE Trans. On Computer-Aided Design, vol. 7, no. 7, pp. 813-833, 1988; H. Takahashi, K. O. Boateng, K. K Saluja, and Y. Takamatsu, "On Diagnosing Multiple Stuck-At Faults Using Multiple and Single Fault Simulation", IEEE Trans. on Computer-Aided Design, vol. 21, no. 5, pp. 362-368, 2002), all by targeting multiple tuck-at faults.

Recently, per-test fault diagnosis is gaining popularity in fault diagnosis for a non-trivial defect scenario. Per-test means that failing vectors are processed one at a time. The basic idea is that only one of the multiple defects in a circuit may be activated by one failing vector in some cases. As a result, a single fault model can be assumed for the activated defect and a relatively easy fault diagnosis procedure based on single fault simulation can be used for a non-trivial defect scenario. Thus, per-test fault diagnosis addresses both temporality and cardinality issues, and has been shown to be highly effective for a non-trivial defect scenario.

A prior art per-test method uses the single stuck-at fault model (see: T. Bartenstein, D. Heaberlin, L. Huisman, and D. Sliwinski, "Diagnosing Combinational Logic Designs Using the Single Location At-a-Time (SLAT) Paradigm" Proc. Intl. Test Conf., pp. 287-296, 2001). Like other per-test fault diagnosis methods, this method is based on two assumptions. The first assumption is that even when multiple defects exist, the simulated output response of a circuit with an assumed single fault may match the actual output response of the corresponding failing circuit under a certain failing input vector. Such a failing input vector is called a SLAT vector. The second assumption is that if the simulated output response of a circuit with an assumed single fault matches the actual output response under a SLAT vector, the possibility that the fault actually links to a physical defect is high. The advantage of the per-test fault diagnosis method is that a single fault model can be used in fault diagnosis for dynamic and multiple defects.

Several other per-test fault diagnosis methods have been proposed (see: S. Venkataraman and S. Drummonds, "POIROT: A Logic Fault Diagnosis Tool and Its Applications", Proc. Intl. Test Conf., pp. 263-262, 2000; J. Waicukauski and E. Lindbloom, "Failure Diagnosis of Structured Circuits", IEEE Design and Test of Comp., vol. 6, no. 4, pp. 49-60, 1989; D. Lavo, I. Hartanto, and T. Larrabee, "Multiplets, Models and the Search for Meaning", Proc. Intl. Test Conf., pp. 250-259, 2002). The single stuck-at fault model is used in the above-mentioned documents of Waicukauski et al., Bartenstein et al. and Lavo et al., while a combination of stuck-at, stuck-open, net, and bridging faults is used in the document of Venkataraman et al. These methods attempt to find a minimal set of faults that explains as many failing vectors as possible. Such a fault set is called a multiplet in the document of Bartenstein et al.

However, the diagnostic resolution or accuracy of the above-mentioned prior art per-test fault diagnosis method is often low for a circuit with complex defects. The major reason is that the single stuck-at fault model cannot accurately represent the logic behaviors of complex defects, such as Byzantine defects. In addition, a simple criterion is used for matching simulated output responses and actual output responses, which often results in diagnostic information loss, leading to misdiagnosis. All these disadvantages contribute to significantly increased cost and time of failure analysis. As a result, there is a strong need to propose a new per-test fault method that can achieve high diagnostic resolution even in the presence of complex, dynamic, and multiple defects.

SUMMARY OF THE INVENTION

Accordingly, a primary object of this present invention is to provide a method and apparatus of per-test fault diagnosis for complex, dynamic, and multiple defects in an integrated logic circuit to achieve high diagnostic resolution.

The present invention is summarized as follows:

(a) X-Fault Model

The X-fault model is defined as follows:

A fanout-free gate has one X-fault, corresponding to any physical defect or defects in the gate or on its output. The X-fault assumes a logic value at the output, which is opposite to the fault-free value at the output. Such an X-fault is called a fanout-free X-fault. On the other hand, a fanout gate has one X-fault, corresponding to any physical defect or defects in the gate or on its fanout branches. The X-fault assumes different X symbols on the fanout branches of the gate to represent unknown logic values in fault simulation. Such an X-fault is called a fanout X-fault.

The X-fault model has the following characteristics:

Generality: One single X-fault can represent all possible faulty logic combinations at a defect site, while multiple stuck-at faults are needed to cover the same defect scenario.

Size: The number of X-faults in a circuit is manageable since it is equal to the number of gates in the circuit.

Accuracy: The X-fault model handles the unknown faulty behavior of a complex defect such as a Byzantine defect with different X symbols. No diagnostic information is lost since no effort is made to aggressively determine faulty logic values with an assumption, such as wired-AND, wired-OR, driving, etc., that may not be always true in reality.

Flexibility: The X-fault model allows a fault to have different faulty behaviors under different input vectors, making it suitable for the per-test fault diagnosis scheme in handling dynamic defects.

(b) New Matching Criterion

All previous per-test fault diagnosis methods use a strict matching criterion, in which a fault simulation result for a fault in a circuit model is compared with the corresponding observed response of the real circuit at all primary outputs under a failing vector. This often results in a mismatch, which leads to lower diagnostic resolution. The present invention uses a relaxed matching criterion, in which comparison is conducted at primary outputs that are structurally reachable from the fault. This can greatly improve diagnostic resolution. Note that primary outputs here include both conventional primary outputs and pseudo primary outputs in a full-scan circuit.

(c) Diagnostic Information Extraction

All previous per-test fault diagnosis methods only use the matching information as diagnostic information. In the present invention, in addition to the matching information between a fault-simulation result and its corresponding circuit response, the number of matched errors and the depth of a fault are also taken into consideration to extract more diagnostic information. This can greatly improve diagnostic resolution.

(d) Diagnosis Value

In the present invention three factors, i.e. the matching information, the number of matched errors, and the depth of a fault, are all used in per-test fault diagnosis. A diagnosis value is calculated for each fault based on the three factors. Generally, the diagnosis value for a fault under a failing input vector is zero if the fault-simulation result and its corresponding circuit response does not match for the fault and the failing input vector. If the fault-simulation result and its corresponding circuit response match, the diagnosis value for the fault under the failing input vector is a value greater than zero, and the value is calculated based on the number of matched errors and the depth of a fault.

(e) Diagnosis Table

The diagnosis values for all faults and all failing input vectors are stored in a diagnosis table. Note that each failing vector remaining in the fault diagnosis table corresponds to at least one fault whose diagnosis value is not zero. From this table, the average diagnosis value for each fault under all failing input vectors are also calculated and stored.

(f) Multiplet Scoring

As all previous per-test fault diagnosis methods, the present invention also finds multiplets as diagnosis results. Suppose that $(X_{ij})_{m \times n}$ is a fault diagnosis table, whose rows correspond to a set of m failing vectors and the columns to a set of n faults. A multiplet is a minimal set of faults $\{F_{j1}, F_{j2}, \ldots, F_{jh}\}$ such that any failing vector $t_i$ in the table corresponds to at least one non-zero entry in $\{X_{ij1}, X_{ij2}, \ldots, X_{ijh}\}$ for $i=1, 2, \ldots, m$. Unlike all previous per-test fault diagnosis methods, however, the present invention scores each multiplet by the sum of the average diagnosis values of all faults in the multiplet. As a result, all multiplets are ordered by their scores.

The new techniques listed in above (a) through (f) greatly improves the capability of per-test fault diagnosis, and makes it possible to achieve high diagnostic resolution even when complex, dynamic, and multiple defects exists in a failing integrated logic circuit.

BRIEF DESCRIPTION OF THE DRAWINGS

The above and other objects, advantages and features of the invention will become more apparent when considered with the following specification and accompanying drawings wherein:

FIG. 5 is a flowchart of the per-test fault diagnosis method, in accordance with the present invention;

FIG. 6 is a detailed flowchart of the X-fault simulation step of FIG. 5, in accordance with the present invention;

FIGS. 10A and 10 are circuit diagrams for explaining the reachable primary outputs, in accordance with the present invention;

FIG. 14 is an example fault diagnosis table, in accordance with the present invention.

DESCRIPTION OF THE PREFERRED EMBODIMENT

Generally, the fault diagnosis method requires high accuracy and high efficiency.

The "accuracy" is defined by a possibility that the faults to be localized may be localized in the suspicious area. That is, when the accuracy is low, the faults to be localized may not be localized in the suspicious area, so that it is impossible to identify the root causes of the faults. On the other hand, when the accuracy is high, the faults to be localized may be localized in the suspicious area, so that it is impossible to identify the root causes of the faults. In other words, the maximum accuracy means that the faults to be localized are always localized in the suspicious area, thus identifying the root causes of the faults.

The "efficiency" is defined by the size of the suspicious area. That is, when the efficiency is low, the size of the suspicious area is large, so that it may take a long time to localize the faults. On the other hand, when the efficiency is high, the size of the suspicious area is small, so that it may take a short time to localize the faults.

Physical defects can be generally characterized from three aspects: simple or complex complexity, static or dynamic temporality, and single or multiple cardinality.

Regarding physical defects of a simple complexity, a static temporality and a single cardinality, high accuracy and high efficiency can be easily achieved by a fault diagnosis method of a single stuck-at-fault model assuming a line to be fixed at logic value "0" or "1". On the other hand, regarding physical defects of a complex complexity, a dynamic temporality or a multiple cardinality, since the single stuck-at-fault model cannot represent such defects, an accurate fault diagnosis method is generally difficult to achieve with high accuracy and high efficiency.

Figure 1:
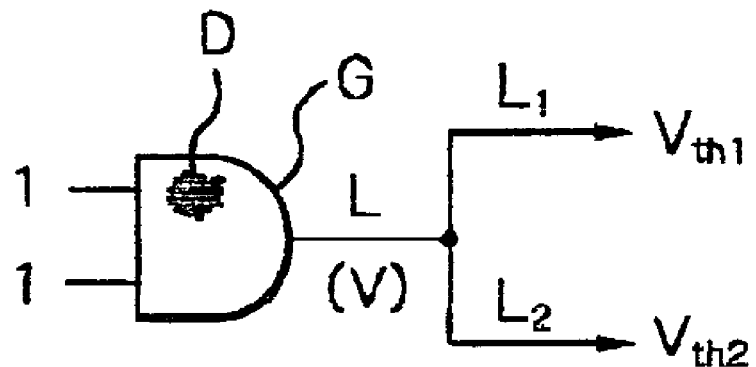
FIG. 1 is an example of a failing circuit with a defect in a gate.
Figure 2:
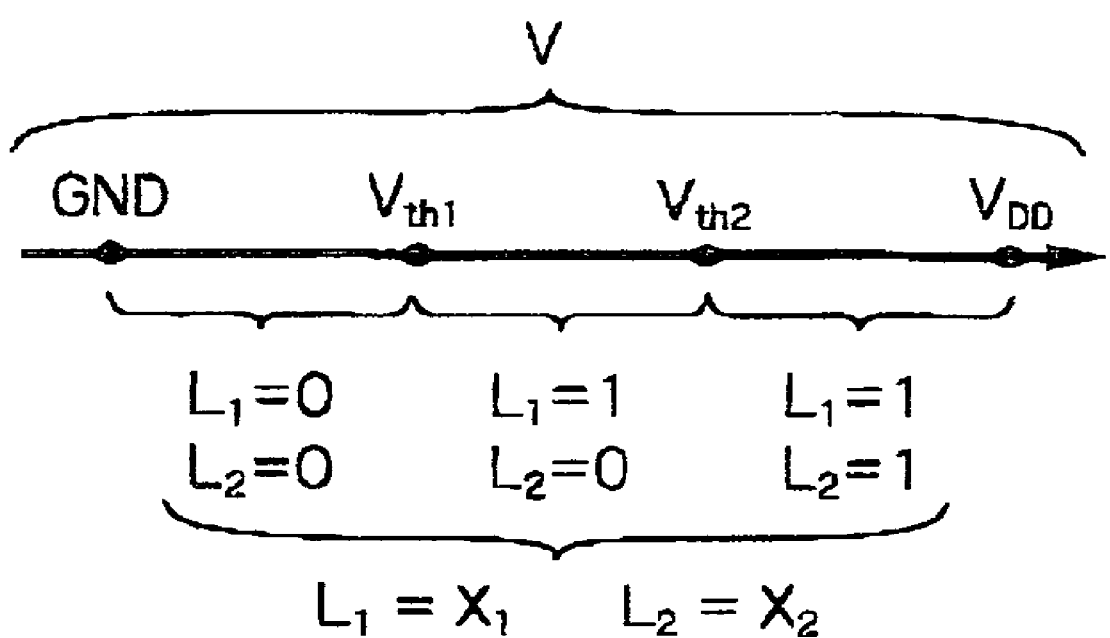
FIG. 2 is a diagram for showing the possibility of multiple logic behaviors of the defect of FIG. 1.

In the above-mentioned prior art per-test fault diagnosis method, however, as explained above, the accuracy is low for a circuit with complex defects, since a misdiagnosis may occur for a Byzantine defect such as a resistive short or open which shows a plurality of logical behaviors as illustrated in FIGS. 1 and 2. Note that FIG. 1 is a circuit diagram for explaining a Byzantine defect, and FIG. 2 is a diagram for explaining fault values of fanout signal lines of FIG. 1.

In FIG. 1, assume that the voltage at an output line L of a gate G is changed by a Byzantine defect D between a ground voltage GND and a power supply voltage $V_{DD}$, and also, fanout signal lines $L_1$ and $L_2$ connected to an output line L of the gate G have threshold voltages $V_{th1}$ and $V_{th2}$, respectively ($V_{th1} < V_{th2}$). Note that the threshold voltages $V_{th1}$ and $V_{th2}$ are actually defined by those of the post-stage input transistors (not shown) connected to the fanout signal lines $L_1$ and $L_2$. In this case, as illustrated in FIG. 2B, the fanout signal lines $L_1$ and $L_2$ have three logic combinations (0, 0), (1, 0) and (1, 1) depending upon the output voltage V of the gate G as illustrated in FIG. 2, and the logic combinations (0, 0) and (1, 0) are possibly faulty. Therefore, it is impossible to know which one will show up due to an unknown defect parameter such as a resistive short defect characterized by a Byzantine defect. This Byzantine defect can be complex when the fanout signal lines $L_1$ and $L_2$ both have faulty logic value "0".

Figure 3:
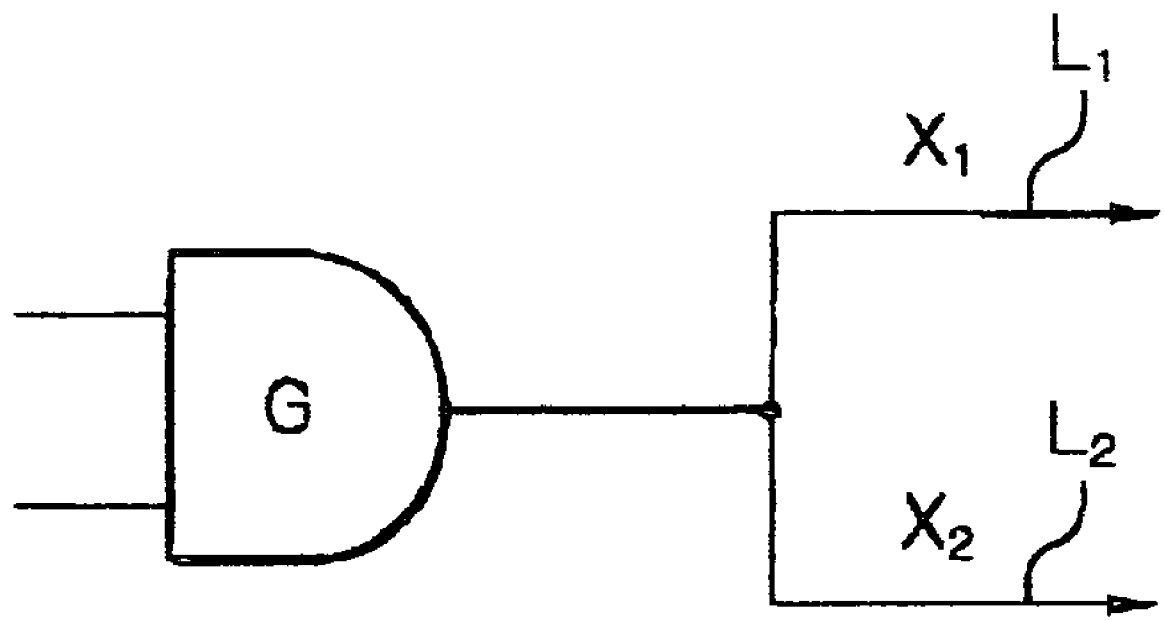
FIG. 3 is an example of the X-fault model, in accordance with the present invention.

In FIG. 3, which illustrates an example of the X-fault model, in accordance with the present invention, $X_1$ and $X_2$ denote two arbitrary faulty logic values. Obviously, $<L_1 = X_1, L_2 = X_2>$ covers any possible faulty logic combination that may appear on $L_1$ and $L_2$ as shown in FIG. 1. Therefore, the fanout X-fault model can closely represent such complex defects as Byzantine defects.

Figures 4A, 4B:
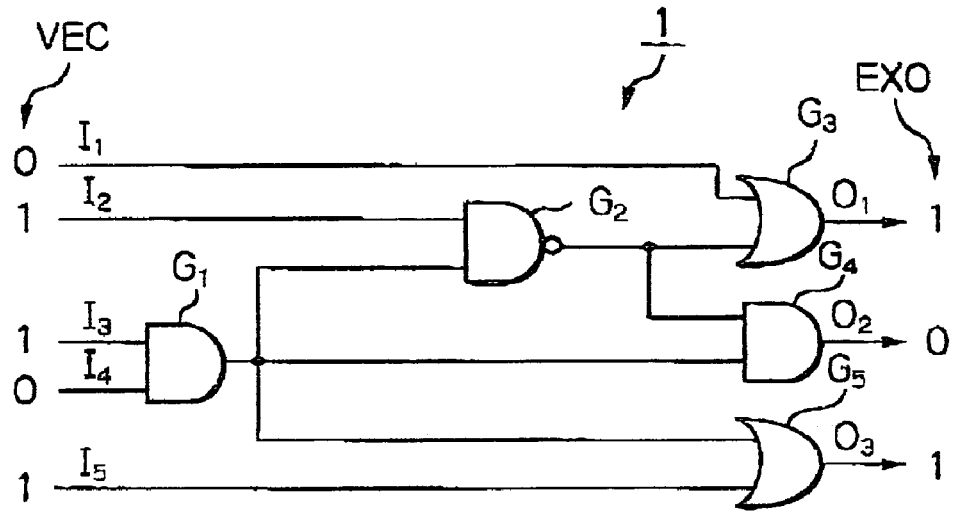
FIG. 4A is an example of an integrated logic circuit.
FIG. 4B is a table showing the relationship between the input vectors and the expected output responses of FIG. 4A.

In FIG. 4A, which illustrates an example of an integrated logic circuit unit 1, this integrated logic circuit unit 1 is formed by gates $G_1$, $G_2$, $G_3$ and $G_4$, five input signal lines $I_1$, $I_2$, ..., $I_5$ and three output signal-lines $0_1$, $0_2$ and $0_3$. In this case, if the integrated logic circuit unit 1 is normally operated under the condition that an input vector VEC is applied to the input signal lines $I_1$, $I_2$, ..., $I_5$, an expected output response EXO is obtained at the output signal lines $0_1$, $0_2$ and $0_3$. An example of the relationship between the input vector VEC and the expected output response EXO is illustrated in FIG. 4B. Note that, in FIG. 4A, an input vector VECi=(0, 1, 1, 0, 1) is applied as the input vector VEC to the input signal lines $I_1$, $I_2$, ..., $I_5$, and its resulting expected output response EXO=(1, 0, 1) is obtained.

An example of the fault diagnosis method in accordance with the present invention will be explained below.

FIG. 5 is a main routine.

First, at step 501, an input vector VEC is initialized to VEC1, i.e., i=1.

Next, at step 502, a failing candidate gate $G_i$ is initialized to $G_1$, j=1.

Next, at step 503, diagnosis information collection is carried out.

This diagnosis information collection step 503 will be explained in detail next with reference to FIG. 6.

First, at step 601, it is determined whether or not the gate $G_i$ has fanout branches. As a result, only if there are such fanout branches, does the control proceed to steps 602 through 604. Otherwise, the control proceeds to steps 605 and 606.

For example, in FIG. 4A, the gates $G_1$ and $G_2$ have fanout branches, while the gates $G_3$, $G_4$ and $G_5$ have no fanout branches.

Figure 7:
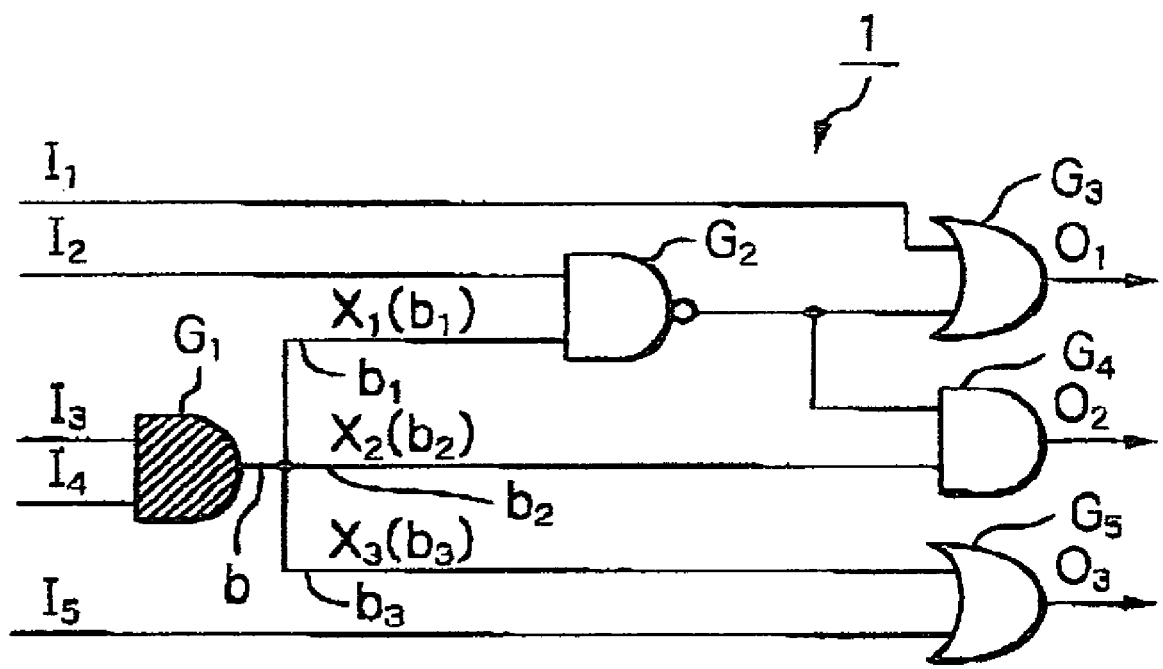
FIG. 7 is a circuit diagram for explaining the X-injection step of FIG. 6, in accordance with the present invention.

At step 602, X-injection is carried out to assign different X symbols for showing uncertain faulty values in the calculation of simulated output responses to the fanout branches of the gate $X_i$. For example, as illustrated in FIG. 7, if the gate $G_1$ is a failing candidate gate having fanout branches $b_1$, $b_2$ and $b_3$, $X_1(b_1)$, $X_2(b_2)$ and $X_3(b_3)$ are injected into the fanout branches $b_1$, $b_2$ and $b_3$, respectively. Here, one X symbol consists of three parts: a letter X, a subscript to distinguish among different X symbols, a plurality of fanout branch names in parenthesis. The different X symbols represent a combination of logic values for showing a complex defect such as a Byzantine defect.

Figure 8:
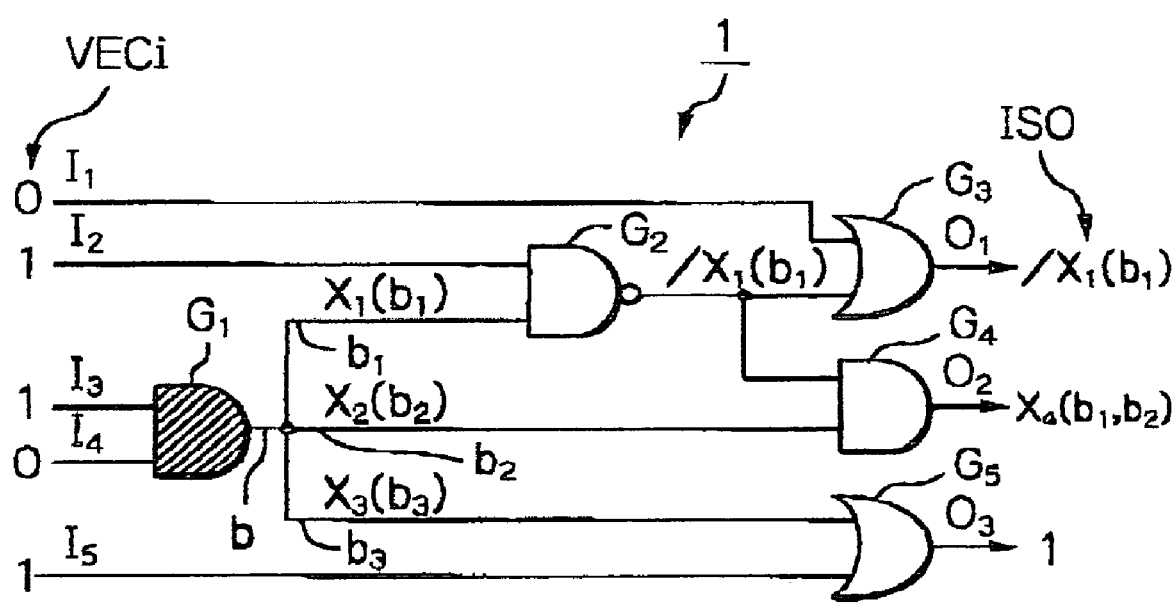
FIG. 8 is a circuit diagram for explaining the X-propagation step of FIG. 6, in accordance with the present invention.

Next, at step 603, X-propagation is carried out to calculate an initial simulated output response ISO. That is, the X symbols injected by the X-injection step 602 are propagated by applying an input vector VEC to the input signal lines $I_1$, $I_2, \ldots, I_5$ under the following conditions:

1) Inverted information should be preserved. That is, a gate having an inverting function preserves inverted information such as $/X_i(b)$. In other words, an inversion of an X symbol is allowed to suppress the generation of new X symbols, so that the number of output signal lines to which the X symbols reach can be effectively decreased. As a result, the power consumption required for X-propagation can be decreased. For example, AND $(X_i(b), /X_i(b))=0$
OR $(X_i(b), /X_i(b))=1$
NAND $(/X_i(b_1, b_2), 1)=X_i(b_1, b_2)$
OR $(X_i(b_1), /X_i(b_1), 0, X_2(b_2))=1$ 2) Branches should be reserved. That is, only when the output signal of a gate which receives X symbols such as $X_1(b_1), X_2(b_2), \ldots, X_h(b_h)$ or their compliments is none of 0, 1, X and /X, is a new X symbol having a new subscript generated at the output of this gate. For example, NOR $(X_3(b_1, b_2), X_2(b_2), X_4(b_3))=X_5(b_1, b_2, b_3)$
AND $(/X_1(b_1), X_3(b_3))=X_6(b_1,b_3)$ An initial simulated output response ISO depends upon an input vector VEC and a gate $G_i$, i.e., a function (VEC, $G_i$). For example, in FIG. 8, ISO (VECi, $G_1$)=$(/X_1(b_1), X_4(b_1, b_2), 1)$ Next, at step 604, X-resolution, i.e., binary logic simulations are carried out by assigning 0 or 1 to the injected X symbols, thus removing the ambiguity. If the injected X symbols are defined by $X_1(b_1), X_2(b_2), \ldots, X_h(b_h)$, the set B of responsible fanout branches is $b_1 \cup b_2 \cup \ldots \cup b_h$. Therefore, $2^h$ runs of binary logic simulations can solve all the X symbols. However, if the threshold voltages of the fanout branches $b_1$, $b_2, \ldots, b_h$ are already known, only (h+1) runs of binary logic simulations can solve all the X symbols. Also, since no consideration is given to the fanout branches not included in a reachable output response RCO which will be explained later, the number of runs of binary logic simulations can be further decreased.

Figure 9:
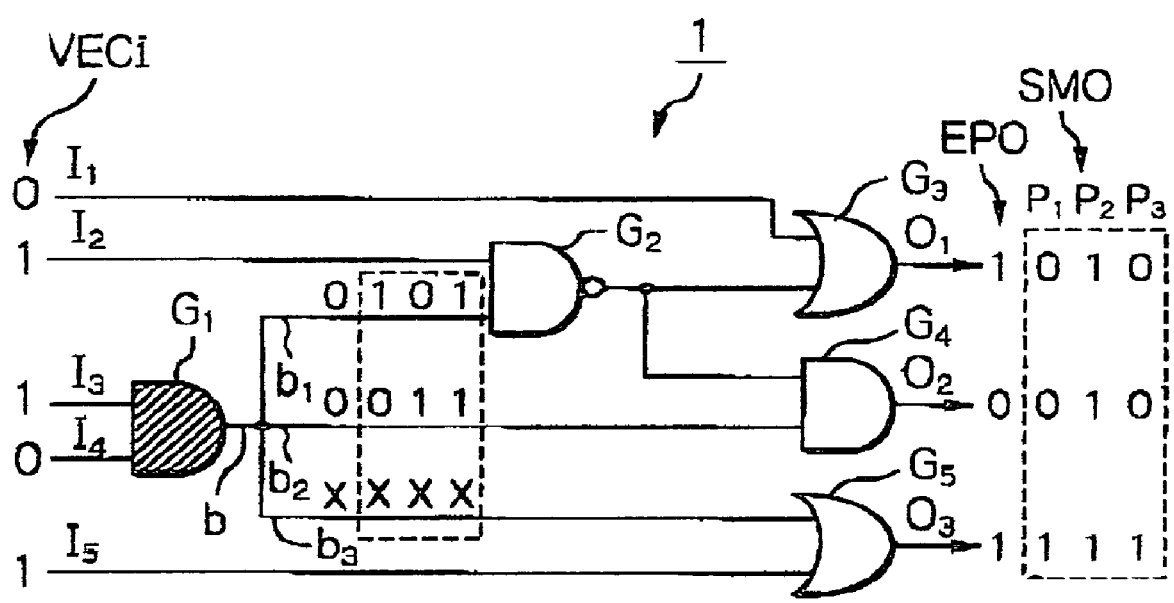
FIG. 9 is a circuit diagram for explaining the X-resolution step of FIG. 6, in accordance with the present invention.

In FIG. 9, since the fanout branches $b_1$ and $b_2$ of the gate $G_1$ reach the output signal lines $0_1$ and $0_2$ as illustrated in FIG. 8, no consideration is given to the fanout branch $b_3$. Therefore, the 4 (=$2^2$) failing combinations of the fanout branches $b_1$, $b_2$ and $b_3$ are (0, 0, X), (1, 0, X), (0, 1, X) and (1, 1, X), so that their simulated output responses SMO may be (1, 0, 1), (0, 0, 1), (1, 1, 1) and (0, 0, 1); however, the simulated output response SMO=(1, 0, 1) is excluded due to the expected output response EPO=(1, 0, 1). Thus, simulated output responses SMO by the X-resolution are $P_1$=(0, 0, 1), $P_2$=(1, 1, 1) and $P_3$=(0, 0, 1).

Thus, one or more simulated output responses are obtained for each combination of one input vector and one faulty gate, which would relax a matching condition which will be explained later.

On the other hand, at step 605, an inverted logic value of a normal logic value is injected into the output line of a faulty gate $G_i$. For example, an inverted logic value 0 is injected into the output signal line of a faulty gate which has a logic value 1 when this gate is normal. This inverted logic value is clearly a failing logic value.

Next, at step 606, a conventional single stuck-at-fault simulation is carried out.

Note that the operations at steps 605 and 606 have no direct relationship to the present invention, and therefore, no detailed description would be necessary for steps 605 and 606.

At step 607, a reachable output response RCO of the output signal lines $0_1$ and $0_2$ and $0_3$, which the output signal of an X faulty gate $X_i$ can reach, is calculated. The reachable output response RCO depends upon the X faulty gate $X_i$. For example, as illustrated in FIG. 10A, the output signal of the faulty gate $G_1$ can reach the output signal line $0_1$ through the gates $G_2$ and $G_3$, the output signal line $0_2$ through the gates $G_2$ and $G_4$ and the output signal line $0_3$ through the gate $G_5$. Therefore, a reachable output response RCO=(1, 1, 1) is obtained. Similarly, as illustrated in FIG. 10B, the output signal of the faulty gate $G_2$ can reach the output signal line $0_1$ through the gate $G_3$ and the output signal line $0_2$ through the gate $G_4$. Therefore, a reachable output response RCO=(1, 1, 0) is obtained.

Then, the control returns to step 504 of FIG. 5.

At step 504 of FIG. 5, a fault diagnosis is carried out in accordance with the actual operation of the integrated logic circuit unit 1.

Figure 11:
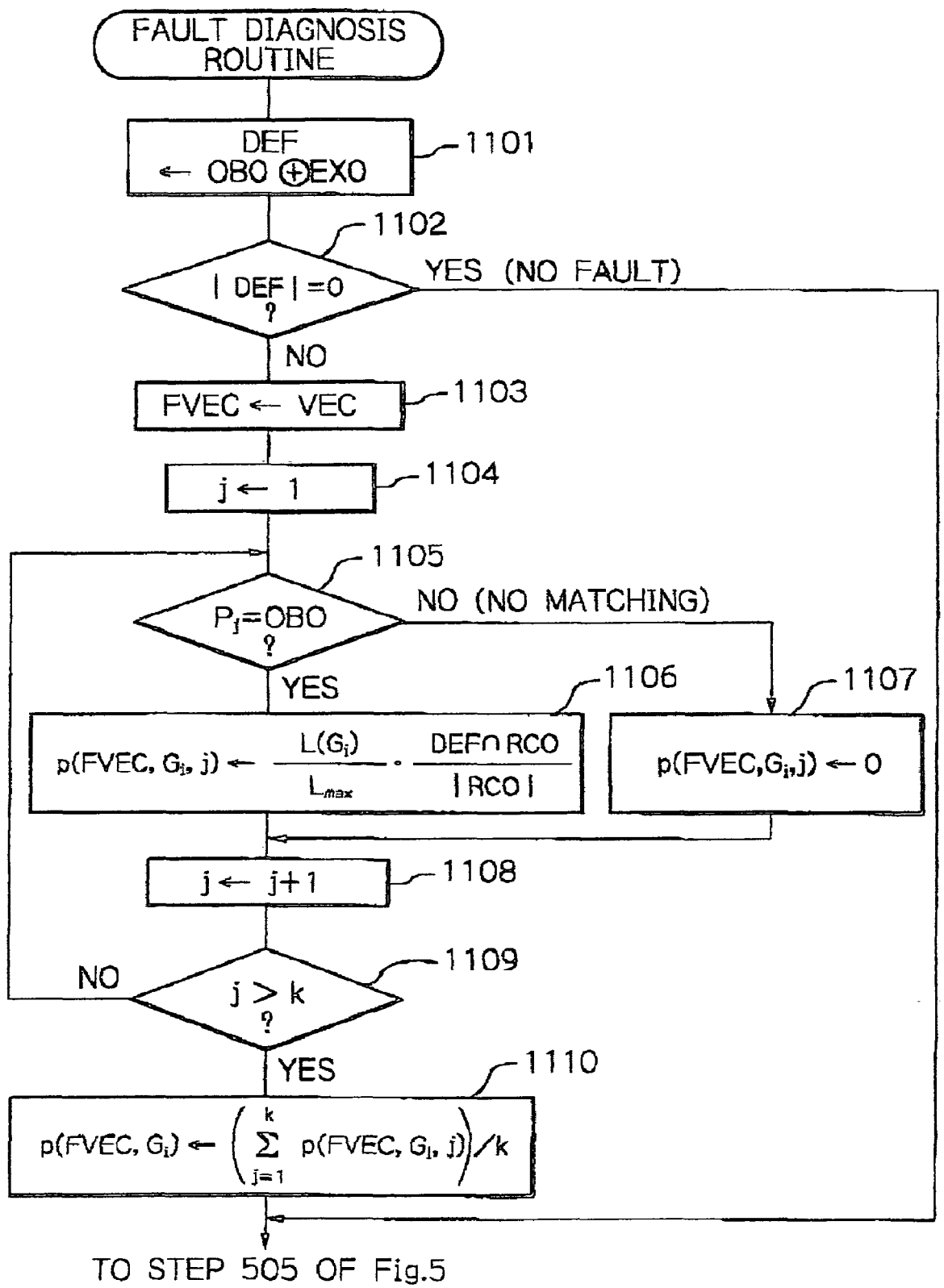
FIG. 11 is a detailed flowchart of the diagnosis value calculation step of FIG. 6, in accordance with the present invention.

The fault diagnosis step 504 is illustrated in detail in FIG. 11. In FIG. 11, note that a gate $G_i$ is assumed to have a plurality of fanout branches. If a gate $G_i$ has no fanout branches, since the prior art single stuck-at-fault simulation is performed upon such a gate $G_i$, the present invention has no relationship to such a gate $G_i$.

First, at step 1101, a difference vector DEP is calculated by an exclusive OR operation between the bits of an observed output response OBO at the output signal lines $0_1$, $0_2$ and $0_3$ of the integrated logic circuit unit 1 and the corresponding bits of its expected output response EXO.

Next, at step 1102, it is determined whether |DEF| is 0. As a result, when |DEF| is 0, this means that the observed output response OBO coincides with the expected-output response EPO, i.e., no fault is generated, so that the control proceeds directly to step 505 of FIG. 5. On the other hand, when |DEF| is not 0, this means that the observed output response OBO does not coincide with the expected output response EPO, i.e., a fault may be generated, so that the control proceeds to step 1103.

At step 1103, the input vector VEC is replaced by a failing input vector FVEC, i.e.,

FVEC←VEC

Steps 1104 to 1110 perform a matching operation between the above-mentioned simulated output response SMO ($P_k$) and the observed output response OBO to obtain fault diagnosis values p(FVEC, $G_i$). In this case, since the fault diagnosis values p(FVEC, $G_i$) are calculated in consideration of an error rate and a fault level, each of the fault diagnosis values p(FVEC, $G_i$) varies from 0 to 1. Note that the fault diagnosis values (matching values) of the prior art per-test fault diagnosis method were 1 (coincidence) or 0 (incoincidence).

Steps 1104 to 1110 are explained in detail below.

At step 1104, a value j for indicating a simulated output response $P_j$ is initialized at 1. Here, assume that simulated output responses $P_1, P_2, \ldots, P_k$ (k≧1) are defined for a failing test input vector FVEC and a failing gate $G_i$.

Next, at 1105, a narrow sense matching operation is carried out. That is, it is determined whether or not the simulated output response $P_j$ coincides with the observed output response OBO. As a result, when the simulated output response $P_j$ coincides with the observed output response OBO, the control proceeds to step 1106. On the other hand, when the simulated output response $P_j$ does not coincide with the observed output response OBO, the control proceeds to step 1107.

At step 1106, a fault diagnosis value p(FVEC, $G_i$, j) as a matching value is calculated by $$p(FVEC, G_i, j) \leftarrow (L(G_i)/L_{max}) \cdot (DEF \cap RCO)/|RCO|$$

where $(DEF \cap RCO)/|RCO|$ defines an effective error rate, and $L(G_i)/L_{max}$ defines a fault level.

Figure 12A:
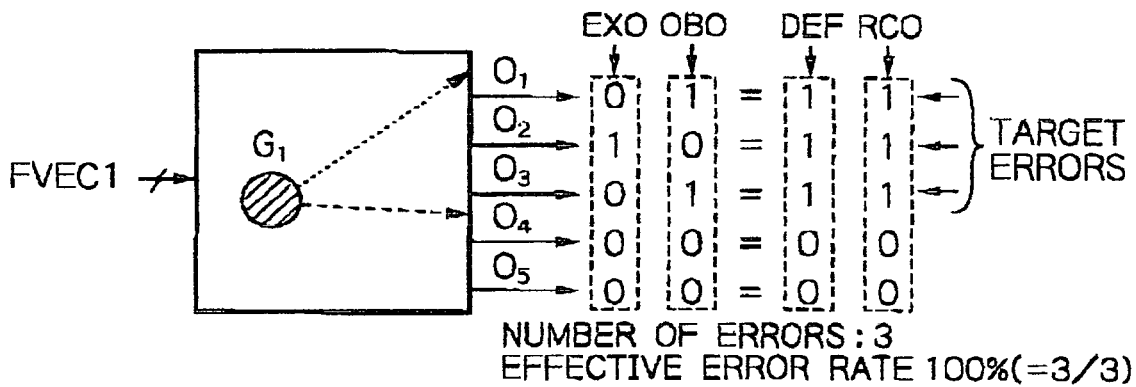
FIGS. 12A, 12B and 12C are diagrams for explaining the effective error rate and the fault level of FIG. 11, in accordance with the present invention.
Figure 12B:
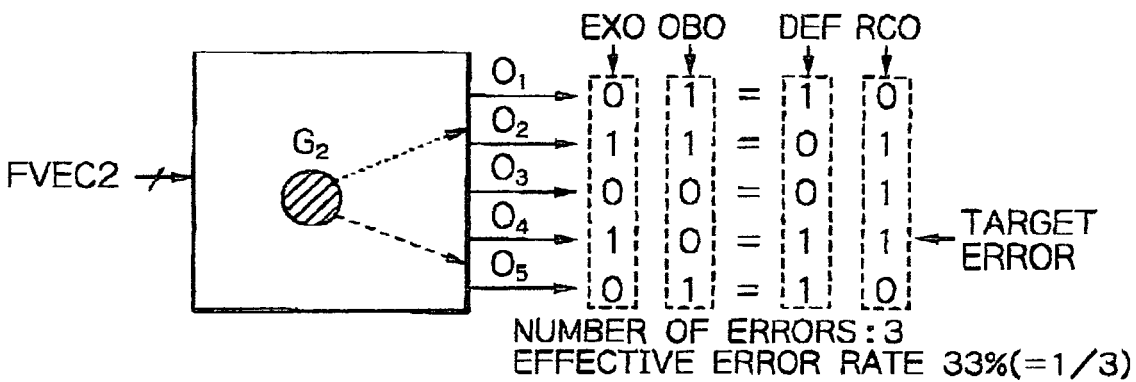

For example, as illustrated in FIG. 12A, for a failing input vector FVEC1 and a faulty gate $G_1$, the number of errors is 3 and the effective error rate is 100% (=3 errors/3 target errors). Also, as illustrated in FIG. 12B, for a failing input vector FVEC2 and a faulty gate $G_2$, the number of errors is 3 and the effective error rate is 33% (=1 errors/3 target errors). Further, as illustrated in FIG. 12C, for a failing input vector FVEC3 and a faulty gate $G_3$, the number of errors is 1 and the effective error rate is 50% (=1 errors/2 target errors).

Figure 12C:
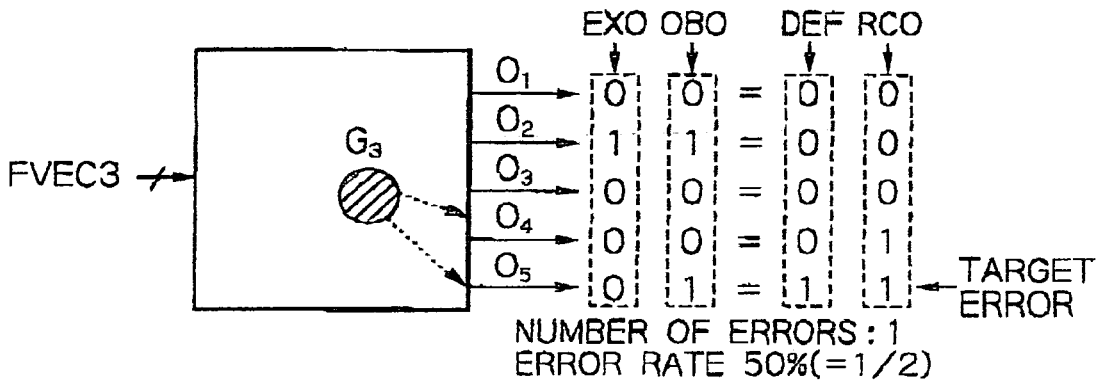

In FIGS. 12A, 12B and 12C, the faulty gate $G_1$ is far from the output signal lines $0_1, 0_2, \ldots, 0_5$ than the gates $G_2$ and $G_3$. Intuitively, faults in the faulty gate $G_1$ hardly appear at the output signal lines $0_1, 0_2, \ldots, 0_5$ as compared with those in the faulty gates $G_2$ and $G_3$. To compensate for this, a fault level L depending upon the substantial distance between the faulty gate $G_i$ and the output signal lines $0_1, 0_2, \ldots$ is adopted. The fault level L is defined as follows:

1) The fault level at the output signal lines $0_1, 0_2, \ldots$ is L=1.

2) If the fault level of an output of one gate is defined by L, the fault level of the input of this gate is defined by L+1.

3) If a gate has a plurality of fanout branches whose fault levels are defined by $L_1, L_2, \ldots$, the fault level of the stem output of this gate is defined by a maximum level of the fault levels $L_1, L_2, \ldots$.

4) $L_{max}$ is defined by a maximum fault level within the integrated logic circuit unit 1.

Figure 13:
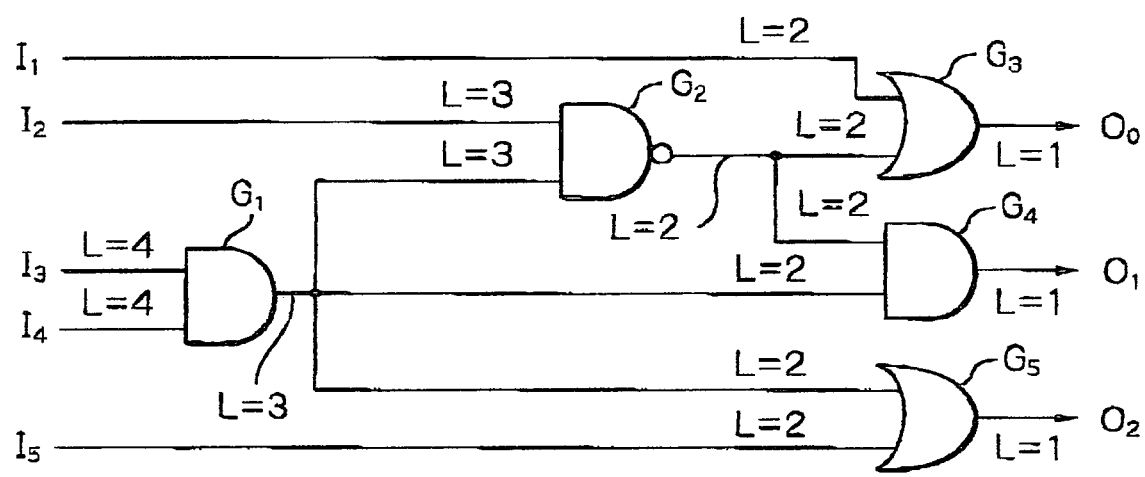
FIG. 13 is a circuit diagram for explaining the definition of the fault level of FIG. 11, in accordance with the present invention.

For example, as illustrated in FIG. 13, the fanout branches of the faulty gate $G_1$ have fault levels L=2 and L=3, and therefore, the stem output of the faulty gate $G_1$ has a fault level L=3 which is the maximum level of L=2 and L=3.

On the other hand, at step 1107, a fault diagnosis value p(FVEC, $G_i$, j) is made 0.

Steps 1108 and 1109 repeat the flow of steps 1105 to 1107 by the number k of the simulated output response $P_j$.

At step 1110, an average value p(FVEC, $G_i$) of the fault diagnosis values p(FVEC, $G_i$, j) is calculated. This average value p(FVEC, $G_i$) is a final fault diagnosis value.

Then, the control returns to step 505 of FIG. 5.

Steps 505 and 506 repeat the flow composed of the information collecting step 503 and the fault diagnosis step 504 by the number of fault candidate gates. That is, step 505 determines whether or not there is a faulty gate left as a faulty candidate gate. Only when there is such a faulty gate, does the control proceed to step 506 which updates $G_i$, and returns to step 503.

Steps 507 and 508 repeat the flow composed of steps 502 through 506 by the number of input vectors. That is, step 507 determines whether or not the input vector VECi is VECm. Only when VECi=VECm, does the control proceed to step 508 which updates VECi and returns to step 502.

At step 509, a fault diagnosis table composed of final fault diagnosis values p(FVEC, $G_i$) as illustrated in FIG. 14 is generated. Note that an average value for each $G_i$ is calculated by $$\Sigma p(FVEC, G_i)/m$$

where m is the number of failing input responses.
For example, in FIG. 9,
$L(G_1)=4$
$L_{max}=4$
If an observed output response OBO is (0, 0, 1), then
$P_1=OBO$
$P_2 \neq OBO$
$P_3=OBO$
Therefore,
p(FVEC, $G_1$, 1)=⅓·⅓=0.33
p(FVEC, $G_1$, 2)=0
p(FVEC, $G_1$, 3)=⅓·⅓=0.33
As a result, $$p(FVEC, G_1) = (0.33 + 0 + 0.33)/3$$
$$= 0.22$$

Next, at step 510, a multiplet is generated. Note that a multiplet is a minimum set of faults such that any failing input vector can be explained by at least one fault in the minimum set.

A multiplet is composed of minimum covers and essential faults.

That is, all essential faults are extracted and excluded from the fault diagnosis table to change it to a target diagnosis table. Note that one essential fault is defined by a fault such that an entry in the fault diagnosis table is the only non-zero entry in the corresponding row (failing input vector) and the corresponding column (faulty gate). The essential faults are indispensable in the multiplet. If there is no essential fault, the target diagnosis table is the same as the original diagnosis table.

In FIG. 14, the faulty gate $G_5$ is an essential fault. Therefore, the faulty gate $G_5$ is excluded from the original fault diagnosis table.

Then, minimal covers are extracted from the fault diagnosis table. Note that one cover is defined by a set of faults such that any failing input vector corresponds to at least one non-zero entry. There may be multiple covers of different sizes. The covers of the smallest size are called minimal covers.

In order to extract the minimal covers, a fault incompatibility graph is formed against the diagnosis table.

A fault compatibility graph can be easily derived from the fault incompatibility graph, since the two graphs are complementary to each other.

Cover candidates are a set of faults showing 8 complete subgraphs:

{$G_1$}, {$G_2$}, {$G_3$}, {$G_4$},
{$G_1, G_3$}, {$G_1, G_4$}, {$G_2, G_3$}, {$G_2, G_4$}

Detected from the 8 complete subgraphs are covers;

{$G_1, G_3$}, {$G_1, G_4$}, {$G_2, G_3$}, {$G_2, G_4$}

Since all these covers have the same size, the covers are minimal covers.

Next, at step 510, multiplets are generated by adding the essential fault $G_5$ to the minimal covers:

{$G_1, G_3, G_5$}, {$G_1, G_4, G_5$}, {$G_2, G_3, G_5$}, {$G_2, G_4, G_5$}

Next, at step 511, scores of the multiplets are calculated to indicate the top diagnosis result. That is, {G₁, G₃, G₅}=0.27+0.36+0.14=0.77
{G₁, G₄, G₅}=0.27+0.04+0.14=0.45
{G₂, G₃, G₅}=0.16+0.36+0.14=0.66
{G₂, G₄, G₅}=0.16+0.04+0.14=0.34

As a result, {G₁, G₃, G₅} is the top diagnosis result.

Then, the routine of FIG. 5 is completed by step 512.

According to the inventors' experiments, in the prior art per-test diagnosis method, the average value of multiplets was large and the average first hit location of the top diagnosis generating multiplets was low. On the other hand, according to the per-test diagnosis method of the present invention, the average value of multiplets was small and the average first hit location of the top diagnosis generating multiplets was high, i.e., almost first rank, at worst third rank.

Note that the above-mentioned flowcharts of FIGS. 5, 6 and 11 can be stored in an ROM or another nonvolatile memory or in a random access memory or another volatile memory.

As explained hereinabove, according to the present invention, high diagnostic resolution can be obtained.

The invention claimed is:

1. A method for fault diagnosis in an integrated logic circuit including a plurality of input lines, a plurality of output lines, and a plurality of logic gates connected between said input lines and said output lines, said method comprising:
   collecting diagnostic information;
   calculating a diagnosis value in accordance with said diagnostic information;
   generating a fault diagnosis table in accordance with said diagnosis value;
   generating multiplets in accordance with said fault diagnosis table; and
   scoring said multiplets.

2. The method as set forth in claim 1, wherein collecting said diagnostic information comprises carrying out fault simulation for each fault under each failing input vector to obtain all simulated responses P1, P2, . . . , Pn, for said fault under said failing input vector, wherein Pi (i =1, 2, . . . , n)=1 if Pi matches an observed response at said output lines that are structurally reachable from one of said logic gates where said fault is assumed and Pi (i=1, 2, . . . , n)=0 if Pi does not match the observed response at said output lines that are structurally reachable from the one of said logic gates where said fault is assumed.

3. The method as set forth in claim 1, wherein calculating said diagnosis value comprises calculating a fault diagnosis value for a fault and a failing input vector by $(L(f)/L_{max}) \cdot |DEF \cap RCO|/|RCO| \cdot ((P1+P2+\ldots+Pn)/n)$, where f is said fault, $L(f)$ is a fault level of said fault, $L_{max}$ is the maximum fault level within said integrated logic circuit, DEF is a set of said output lines with errors under said failing input vector, RCO is a set of said output lines that are structurally reachable from one of said gates where said fault is assumed, n is a total number of simulated response for said fault under said failing input vector, Pi(i=1, 2, . . . , n) is an i-th simulated response for said fault under said failing input vector, wherein Pi(i =1, 2, . . . , n)=1 if pi matches an observed response at output lines that are structurally reachable from the one of said gates where said fault is assumed and Pi(i =1, 2, . . . , n)=0 if Pi does not match the observed response at said output lines that are structurally reachable from the one of said gates where said fault is assumed.

4. The method as set forth in claim 3, wherein calculating said fault diagnosis value comprises using the following conditions:

(a) the fault level of each of said output lines is L=1;
   (b) the fault level of all input lines of a gate is L+1 if the fault level of the output line of said gate is L; and
   (c) the fault level of a stem line is a maximum value among $L_1, L_2, \ldots, L_m$ if the fault levels of all fanout branches from said stem line are $L_1, L_2, \ldots, L_m$.

5. The method as set forth in claim 1, wherein generating said fault diagnosis table comprises storing a diagnosis value far each fault and each failing input vector in a two-dimensional table, (Xij)m×n, where m comprises a number of rows in the table and n comprises a number of columns in the table, whose m rows correspond to a set of m failing input vectors and n columns correspond to a set of n faults.

6. The method as set forth in claim 1, wherein generating said multiplet comprises finding all or a number of multiplets from a fault diagnosis table, said multiplet being a minimal set of faults {FJ1, Fj2, . . . , Fjh} such that any failing vector ti in said fault diagnosis table corresponds to at least one non-zero entry in {Xij1, Xij2, . . . , Xijh} for i =1, 2, . . . , m, wherein (Xij)m×n Is said fault diagnosis table, where m comprises a number of rows in the table and n comprises a number of columns in the table, whose m rows correspond to a set of m failing input vectors and n columns correspond to a set of n faults.

7. The method as set forth in claim 1, wherein scoring said multiplet comprises calculating a score of each generated multiplet, said score of said multiplet being a sum of average diagnosis values for all faults in said multiplet, where the average diagnosis value of a fault is an average value of all diagnosis values of said fault for all failing input vectors.

8. The method as set forth in claim 1, wherein said diagnostic information is collected at primary outputs that are structurally reachable from a fault.

9. The method as set forth in claim 8, wherein said primary outputs comprise conventional primary outputs and pseudo primary outputs in a full-scan circuit.

10. The method as set forth in claim 1, wherein said diagnostic information comprises:
    matching information between a fault-simulation result and a corresponding circuit response;
    a number of matched errors; and
    a depth of said fault.

11. A computer program recorded on a computer-readable storage medium, which when executed performs fault diagnosis in an integrated logic circuit including a plurality of input lines, a plurality of output lines, and a plurality of logic gates connected between said input lines and said output lines, comprising:
    a computer readable program code for collecting diagnostic information;
    a computer readable program code for calculating a diagnosis value in accordance with said diagnostic information;
    a computer readable program code for generating a fault diagnosis table in accordance with said diagnosis value;
    a computer readable program code for generating multiplets in accordance with said fault diagnosis table; and
    a computer readable program code for scoring said multiplets.

12. The computer program recorded on a computer-readable storage medium as set forth in claim 11, wherein collecting said diagnostic information computer readable program code comprises a computer readable program code for carrying out a fault simulation for each fault under each failing input vector to obtain all simulated responses P1, P2, . . . , Pn, for said fault under said failing input vector, wherein Pi (i =1, 2, . . . , n) =1 if Pi matches an observed response at said output lines that are structurally reachable from one of said logic gates where said fault is assumed and Pi (i=1, 2, ..., n) =0 if Pi does not match the observed response at said output lines that are structurally reachable from the one of said logic gates where said fault is assumed.

13. The computer program recorded on a computer-readable storage medium as set forth in claim 11, wherein said calculating of said diagnosis value computer readable program code comprises a computer readable program code for calculating a fault diagnosis value for a fault and a failing input vector by $(L(f)/L_{max}) \cdot |DEF \cap RCO|/|RCO| \cdot ((P1+P2+...+Pn)/n)$, where f is said fault, $L(f)$ is a fault level of said fault, $L_{max}$ is the maximum fault level within said integrated logic circuit, DEF is a set of said output lines with errors under said failing input vector, RCO is a set of said output lines that are structurally reachable from one of said gates where said fault is assumed, n is the total number of simulated response for said fault under said failing input vector, Pi (i=1, 2, ..., n) is an i-th simulated response for said fault under said failing input vector, wherein Pi (i=1, 2, ..., n)=1 if pi matches an observed response at output lines that are structurally reachable from the one of said gates where said fault is assumed and Pi (i=1, 2, ..., n)=0 if Pi does not match the observed response at said output lines that are structurally reachable from the one of said gates where said fault is assumed.

14. The computer program recorded on a computer-readable storage medium as set forth in claim 13, wherein said calculating of said fault diagnosis value computer readable program code comprises a computer readable program code for using the following conditions:

(a) the fault level of each of said output lines is L=1;

(b) the fault level of all input lines of a gate is L+1 if the fault level of the output line of said gate is L; and (c) the fault level of a stem line is a maximum value among $L_1, L_2, ..., Lm$ if the fault levels of all fanout branches from said stem line are $L_1, L_2, ..., Lm$.

15. The computer program recorded on a computer-readable storage medium as set forth in claim 11, wherein generating said fault diagnosis table computer readable program code comprises a computer readable program code for storing a diagnosis value for each fault and each failing input vector in a two-dimensional table, (Xij)m×n, where m comprises a number of rows in the table and n comprises a number of columns in the table, whose m rows correspond to a set of m failing input vectors and n columns correspond to a set of n faults.

16. The computer program recorded on a computer-readable storage medium as set forth in claim 11, wherein generating said multiplet computer readable program code comprises a computer readable program code for finding all or a number of multiplets from a fault diagnosis table, said multiplet being a minimal set of faults {Fj1, Fj2, ..., Fjh} such that any failing vector ti in said fault diagnosis table corresponds to at least one non-zero entry in {Xij1, Xij2, ..., Xijh} for i=1, 2, ..., m, wherein (Xij)m×n is said fault diagnosis table, where m comprises a number of rows in the table and n comprises a number of columns in the table, whose m rows correspond to a set of at failing input vectors and n columns correspond to a set of n faults.

17. The computer program recorded on a computer-readable storage medium as set forth in claim 11, wherein said scoring of said multiplets computer readable program code comprises a computer readable program code for calculating a score of each generated multiplet, said score of said multiplet being a sum of average diagnosis values for all faults In said multiplet, where the average diagnosis value of a fault is an average value of all diagnosis values of said fault for all failing input vectors.

* * * * *